United States Patent [19]

Bergemont

[11] Patent Number: 5,397,726
[45] Date of Patent: * Mar. 14, 1995

[54] SEGMENT-ERASABLE FLASH EPROM

[75] Inventor: Albert Bergemont, Santa Clara, Calif.

[73] Assignee: National Semiconductor Corporation, Santa Clara, Calif.

[*] Notice: The portion of the term of this patent subsequent to Sep. 21, 2010 has been disclaimed.

[21] Appl. No.: 217,076

[22] Filed: Mar. 25, 1994

Related U.S. Application Data

[63] Continuation of Ser. No. 892,259, Jun. 2, 1992, abandoned, which is a continuation-in-part of Ser. No. 830,938, Feb. 4, 1992, Pat. No. 5,346,842.

[51] Int. Cl.$^6$ ............................................. H01L 21/70
[52] U.S. Cl. .......................................... 437/43; 437/44; 437/48; 437/52
[58] Field of Search ................... 437/43, 44, 48, 52; 257/315, 322

[56] References Cited

U.S. PATENT DOCUMENTS

| | | | |
|---|---|---|---|
| 4,804,637 | 2/1989 | Smayling | 437/52 |
| 4,822,750 | 4/1989 | Perlegos et al. | 437/52 |
| 4,851,365 | 7/1989 | Jeuch | 437/43 |
| 5,081,054 | 1/1992 | Wu et al. | 437/43 |
| 5,120,670 | 6/1992 | Bergemont | 437/43 |

FOREIGN PATENT DOCUMENTS

| | | | |
|---|---|---|---|
| 0356346 | 2/1990 | European Pat. Off. | H01L 27/10 |
| 0027245 | 1/1989 | Japan . | |
| 127245 | 1/1989 | Japan | H01L 21/90 |
| 0132862 | 5/1990 | Japan . | |
| 2132862 | 5/1990 | Japan | H01L 29/788 |
| 2284473 | 11/1990 | Japan | H01L 29/788 |
| 9284473 | 11/1990 | Japan . | |

OTHER PUBLICATIONS

Boaz Eitan, R. Kazerounian and A. Bergemont, "Alternate Metal Virtual Ground (AMG)-A New Scaling Concept for Very High-Density EPROM's", IEEE Electron Device Letters, vol. 12, No. 8, Aug. 1991 pp. 450-452.

Kuniyoshi Yoshikawa et al., "An Asymmetrical Lightly Doped Source Cell for Virtual Ground High-Density EPROM's", IEEE Transactions on Electron Devices, vol. 37, No. 4, Apr. 1990, pp. 1046-1051.

*Primary Examiner*—Tom Thomas
*Attorney, Agent, or Firm*—Limbach & Limbach

[57] ABSTRACT

A segment-erasable flash EPROM array formed in a silicon substrate of P-type conductivity comprises a layer of gate oxide formed on the silicon substrate. A first layer of polysilicon is formed on the gate oxide. A layer of oxide/nitride/oxide composite is formed on the first polysilicon layer. The ONO and underlying Poly1 define a plurality of parallel strips. N-type dopant introduced into the silicon substrate between the ONO/-Poly1 strips define buried N+ bit lines. Alternate buried N+ bit lines have additional N-dopant introduced thereto to define graded source lines that alternate with buried N+ drain lines. Each of the graded source lines is contacted only at a plurality of EPROM cells sharing that graded source line such that the EPROM array is subdivided into a plurality of segments. The alternate drain lines are uncontacted. A plurality of Poly2 word lines are formed perpendicular to the ONO/Poly1 strips such that the intersection of the Poly2 word lines and the Poly1 strips define the location of a cross-point EPROM cell of the array. Each segment of the array include first and second Poly2 select lines, the intersection of which with the Poly1 defines first and second select transistors such that each buried N+ drain lines is electrically connectable to one of its adjacent graded source lines via the first select transistor and to the other adjacent graded source line via the second select transistor. Finally, each segment also includes segment select lines that define the gate of a segment select transistor associated with each end of the graded source line.

8 Claims, 8 Drawing Sheets

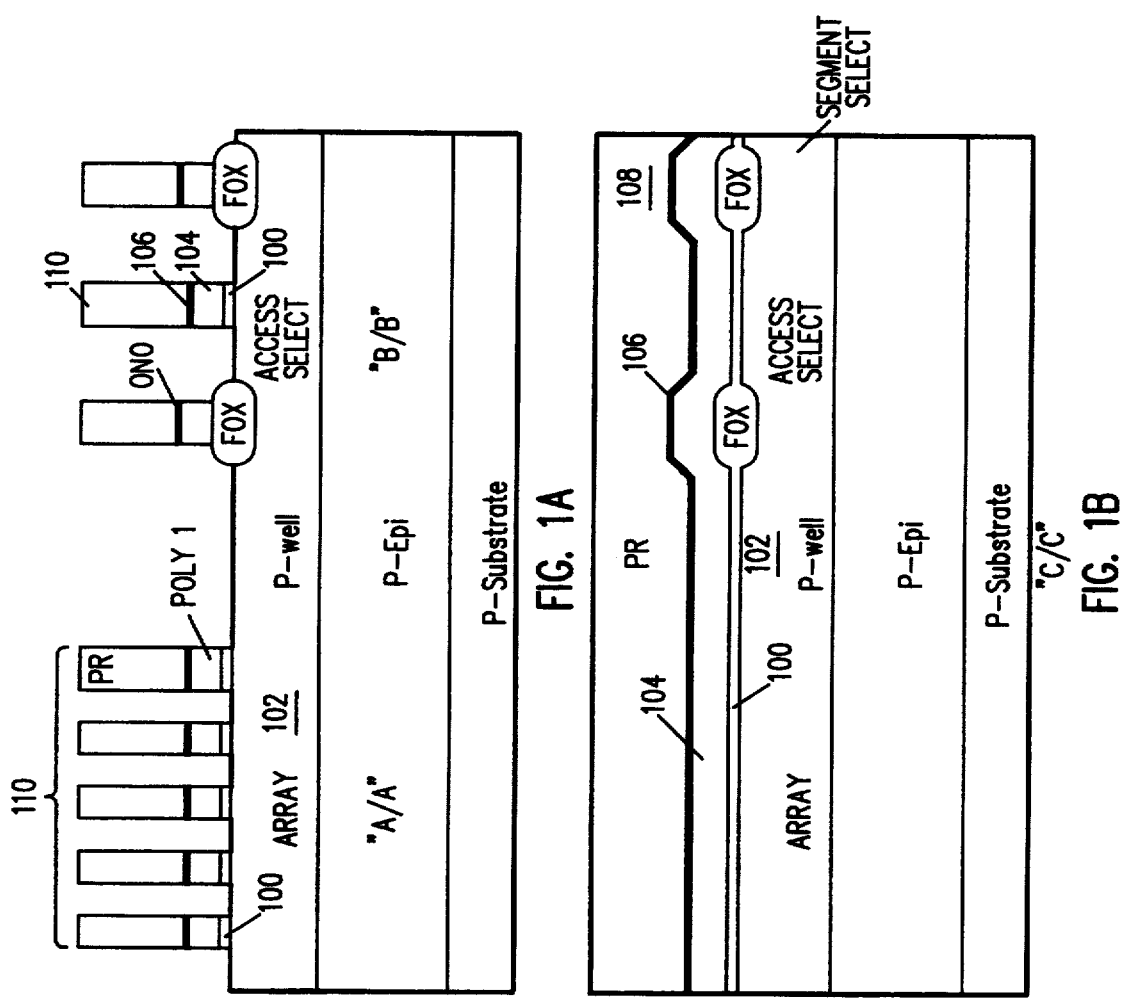

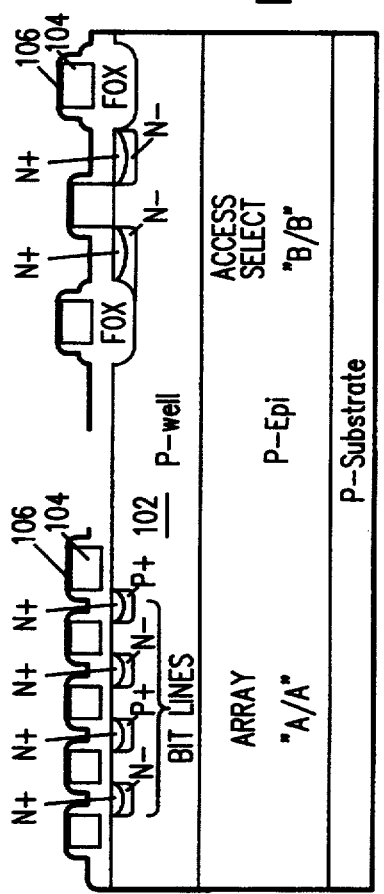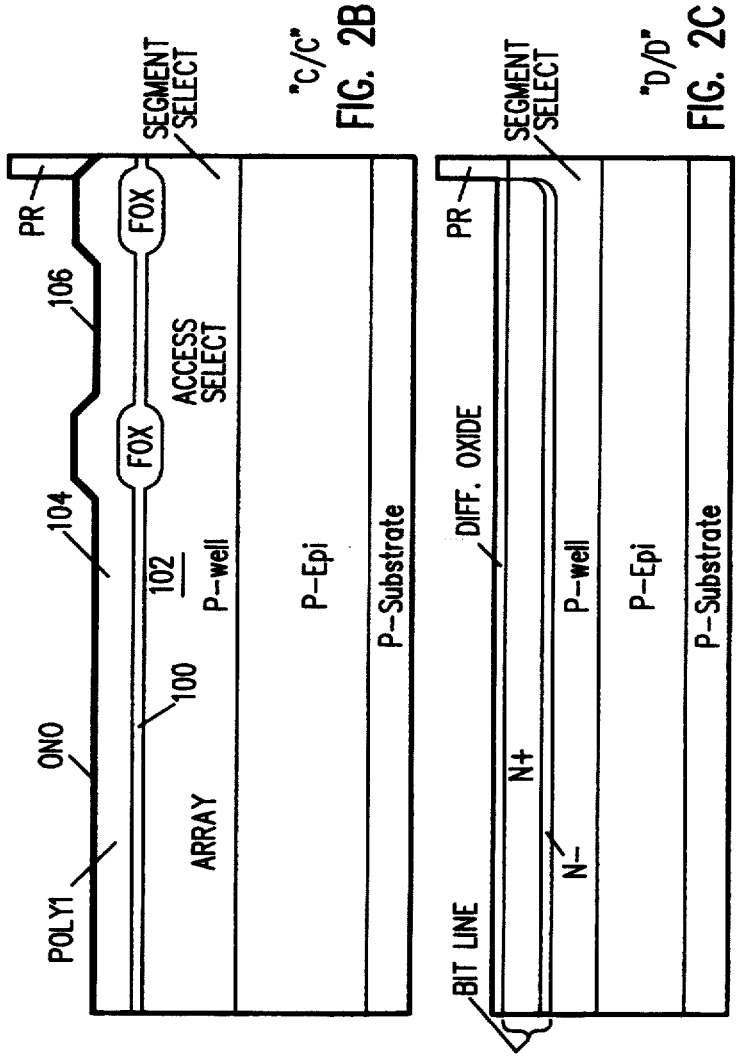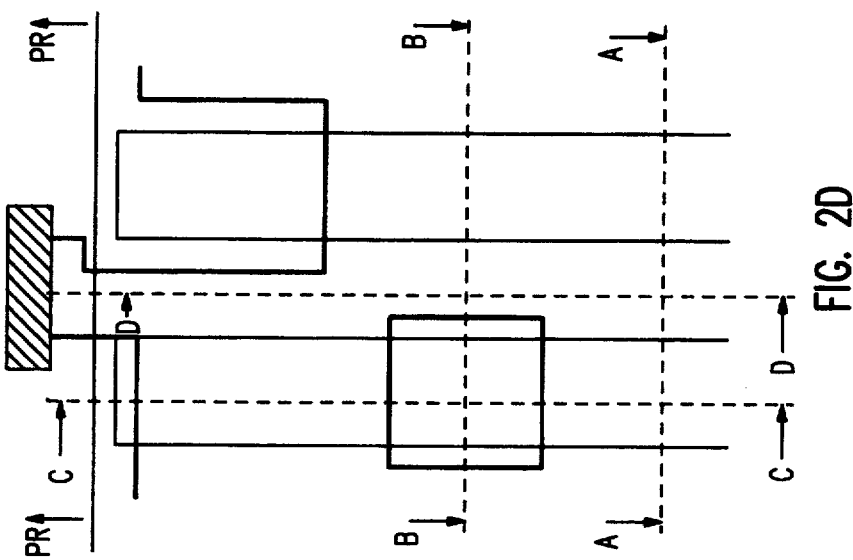

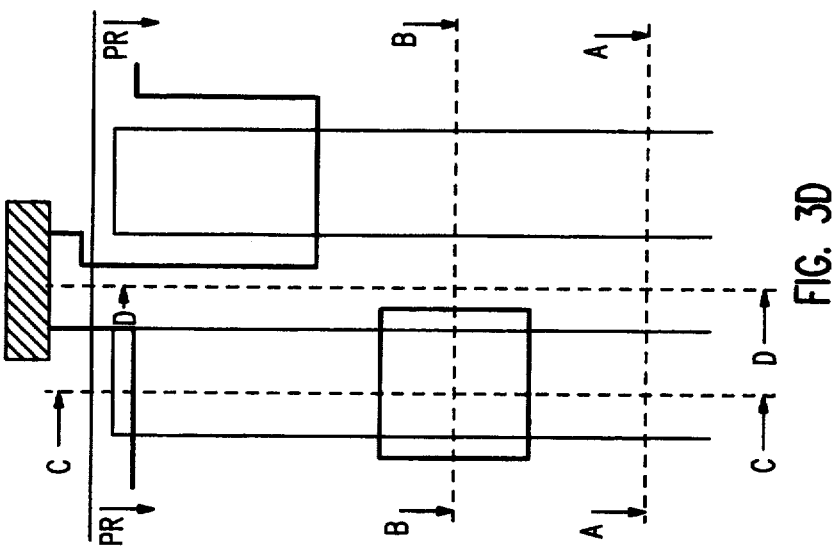
FIG. 3D
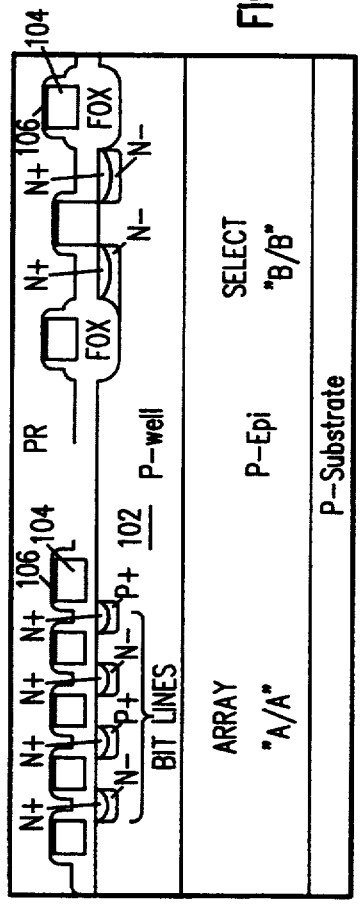
FIG. 3A "A/A"
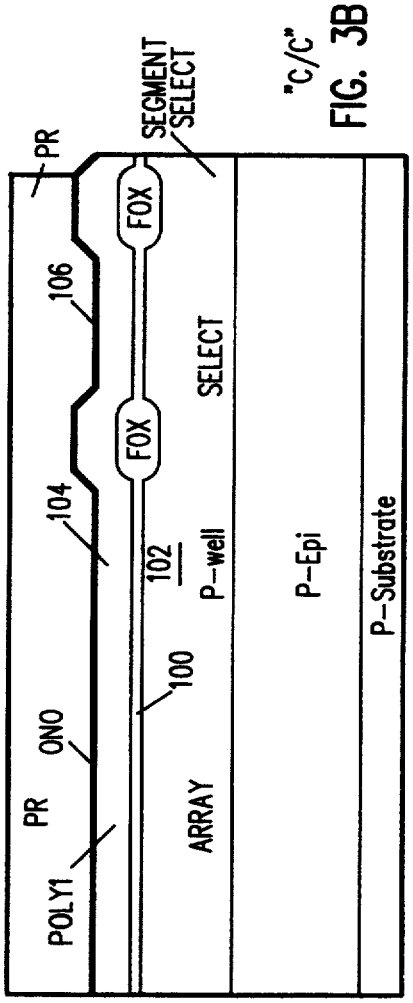
"C/C" FIG. 3B
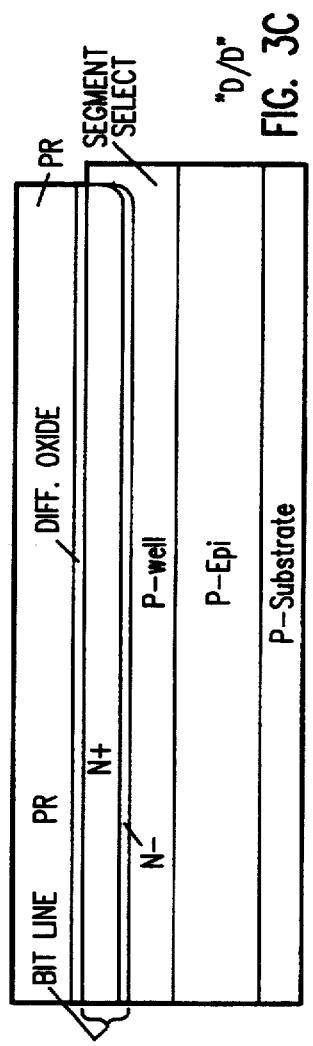
"D/D" FIG. 3C

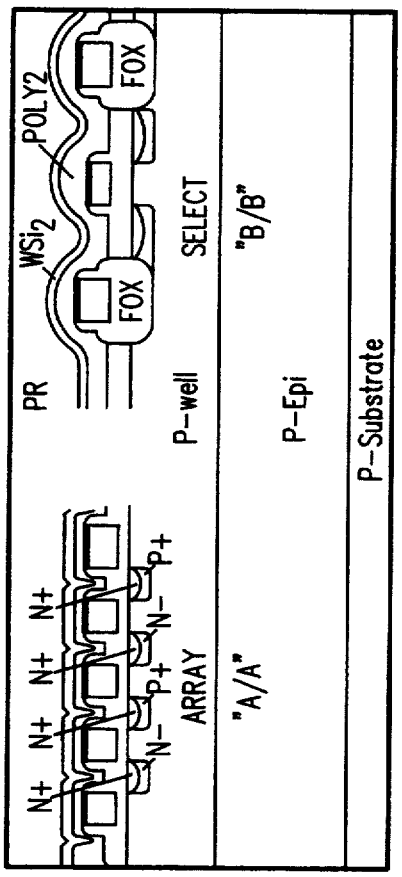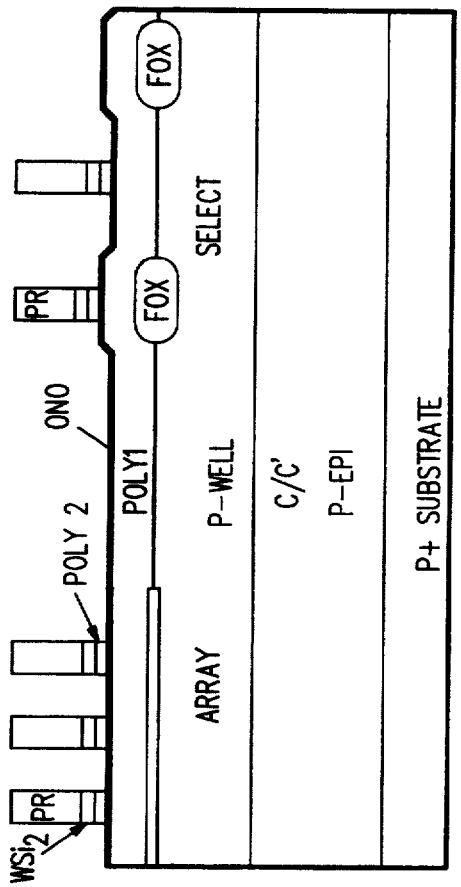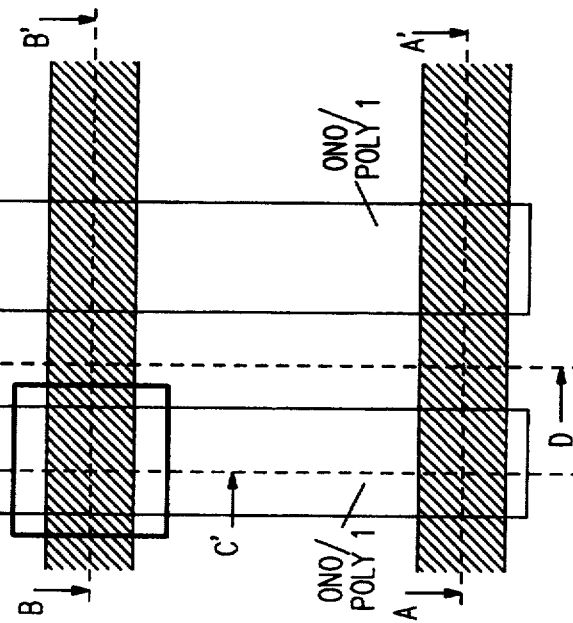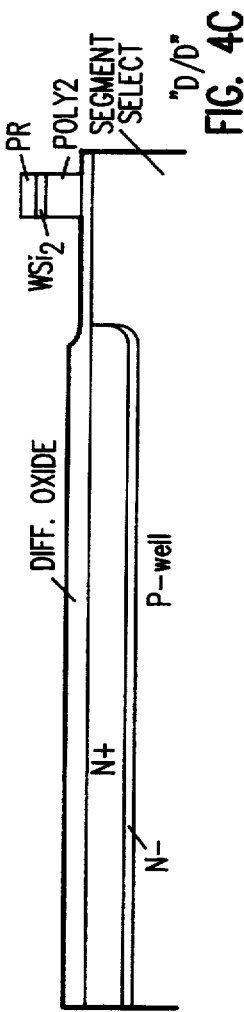
FIG. 4A
FIG. 4B
FIG. 4C
FIG. 4D

SEGMENT-ERASABLE FLASH EPROM

RELATED APPLICATIONS

This is a continuation of application Ser. No. 07/892,259, filed on Jun. 2, 1992, now abandoned, which application is a continuation-in-part of U.S. patent application Ser. No. 07/830,938, filed Feb. 4, 1992, now U.S. Pat. No. 5,346,842, by Albert Bergemont for ALTERNATE METAL/SOURCE VIRTUAL GROUND FLASH EPROM CELL ARRAY. The foregoing related application is hereby incorporated by reference to provide additional background information regarding the present invention.

BACKGROUND OF THE INVENTION

1. Field of the Invention

The present invention relates to electrically programmable read only memory (EPROM) devices and, in particular, to a flash EPROM array that incorporates segment select lines to provide enhanced read access speed and true segment erase.

2. Discussion of the Prior Art

In a "flash" EPROM device, all cells in the data storage array are electrically erased in a single operation. That is, unlike electrically erasable programmable read only memories (EEPROMs), which require larger storage cell size, individual storage cells in a flash EPROM array cannot be selectively erased.

Albert Bergemont's U.S. patent application Ser. No. 07/830,938, referenced above, discloses a novel "contactless" flash EPROM array architecture that provides reduced cell size and ease of scalability while retaining the programming and erase simplicity of conventional flash EPROMs.

The Bergemont contactless EPROM array utilizes cross-point cells formed in a P-type silicon substrate. The array comprises a layer of gate oxide formed on a P-type silicon substrate. Parallel strips of oxide/nitride/oxide (ONO) and underlying first polysilicon (Poly1) are formed on the gate oxide, the Poly1 providing the floating gates for the cells of the array. Buried N+ bit lines are formed in the substrate between the ONO/Poly1 strips. Alternate buried N+ bit lines have additional N-type dopant introduced thereto to form graded source lines that alternate with buried N+ drain lines. The graded source bit lines are contacted by metal in segmented fashion, i.e. there is only one source contact for every 32 or 64 cells in a given column of the array. The intermediate buried N+ drain lines are uncontacted. The array's Poly2 word lines are formed perpendicular to the ONO/Poly1 strips such that the word lines are separated from the Poly1 floating gates by the ONO to define "cross-point" cells. Each buried N+ drain line is electrically connectable to one of its adjacent graded source lines via a first select transistor that has its gate provided by a first Poly2 select line and to the other adjacent graded source line via a second select transistor that has its gate provided by a second select line. The first and second select transistors are also cross-point flash EPROM cells defined by the intersection of Poly2 select lines and the N+ bit lines.

As explained by Boaz Eitan in U.S. patent application Ser. No. 539,657, filed Jun. 13, 1990, now U.S. Pat. No. 5,204,835, the use of segmented bit lines and select transistors inhibits drain turn-on in unselected cells in unselected segments during programming.

A selected cell in the Bergemont array is programmed by maintaining the word line of the selected cell at the programming voltage. The first adjacent graded source line is maintained at a high voltage, while the second adjacent graded source line is maintained at a low voltage. A high voltage level is then applied to the first select line while the second select line is held at the low voltage level to pull up the high voltage on the intermediate noncontacted drain bit line. Thus, hot electrons are injected onto the floating gate of the selected cell.

The Bergemont array is erased by applying an erase voltage to each of the graded source lines and holding both the first select line and the second select line at the low voltage level. Thus, for each programmed flash EPROM cell in the array, electrons tunnel from the floating gate of the cell to the graded source of the cell.

While the above-described Bergemont flash EPROM array provides significant advantages over the prior art, it, like other prior art flash EPROM arrays, is limited to full array erase. Also, since all segments of the array must be precharged for a read operation, read access speed to a selected EPROM cell is limited.

Therefore, it would be desireable to have available a flash EPROM array that provides increased read access speed and true segment erase.

SUMMARY OF THE INVENTION

A preferred embodiment of the present invention provides a segment-erasable flash EPROM array formed in a silicon substrate of P-type conductivity. The segment-erasable EPROM array comprises a layer of gate oxide formed on the silicon substrate. A first layer of polysilicon is formed on the gate oxide. An oxide/nitride/oxide composite is formed on the first polysilicon layer. The ONO and underlying Poly1 define parallel strips, the Poly1 providing the floating gates of the cells in the array. N-type dopant introduced into the silicon substrate between the ONO/Poly1 strips defines buried N+ bit lines. Alternate buried N+ bit lines have additional N-dopant introduced thereto to define graded N+/N− source lines that are adjacent intermediate buried N+ drain bit lines. Each of the graded source lines is contacted only once for a plurality of EPROM cells sharing that particular graded source line, thus subdividing the flash EPROM array into a plurality of segments. The intermediate drain bit lines are uncontacted. Poly2 wordlines are formed perpendicular to the ONO/Poly1 strips such that the intersection of a Poly2 word line and a Poly1 floating gate defines the location of a cross-point flash EPROM cell. Each segment of the array includes first and second Poly2 select lines, the intersection of which with the Poly1 defines first and second select transistors such that each buried N+ drain line is electrically connectable to one of its adjacent graded source lines via the first select transistor and to the other adjacent graded source line via the second select transistor. Finally, and in accordance with the present invention, each segment in the array also includes first and second segment select lines that define the gate of segment select transistors located at oppposite ends of each graded source line in the segment. The segment select transistors are utilized to enable a specified segment(s) in the array for read or erase operations. This results in reduced bit line capacitance during read operations and, thus, faster read access. It also enables true segment erase in a flash EPROM array.

A better understanding of the features and advantages of the present invention will be obtained by reference to the following detailed description and accompanying drawings which set forth an illustrative embodiment in which the principals of the invention are utilized.

DESCRIPTION OF THE DRAWINGS

FIG. 1A is a cross-sectional drawing taken along line A—A in the FIG. 1C layout.

FIG. 1B is a cross-sectional drawing taken along B—B in the FIG. 1C layout.

FIG. 1C is a layout drawing illustrating an intermediate structure formed by a process in accordance with the present invention after formation of a poly 1 mask.

FIG. 2A is a cross-sectional drawing taken along line A—A in the FIG. 2D layout.

FIG. 2B is a cross-sectional drawing taken along line B—B in the FIG. 2D layout.

FIG. 2C is a cross-sectional drawing taken along line C—C in the FIG. 2D layout.

FIG. 2D is a layout drawing illustrating an intermediate structure formed by a process in accordance with the present invention after the poly 1 mask has been stripped.

FIG. 3A is a cross-sectional drawing taken along line A—A in the FIG. 3D layout.

FIGS. 3B and 3C are cross-sectional drawings taken along lines B—B and C—C in the FIG. 3D layout.

FIG. 3D is a layout drawing illustrating an intermediate structure formed by a process in accordance with the present invention after formation of the protect array mask.

FIG. 4A is a cross-sectional drawing taken along line A—A in FIG. 4D.

FIG. 4B is a cross-sectional drawing taken along line B—B in FIG. 4D.

FIG. 4C is a cross-sectional drawing taken along line C—C in FIG. 4D.

FIG. 4D is a layout drawing illustrating an intermediate structure formed by a process in accordance with the present invention after definition of the poly2 word lines.

DETAILED DESCRIPTION OF THE INVENTION

Figure 5:
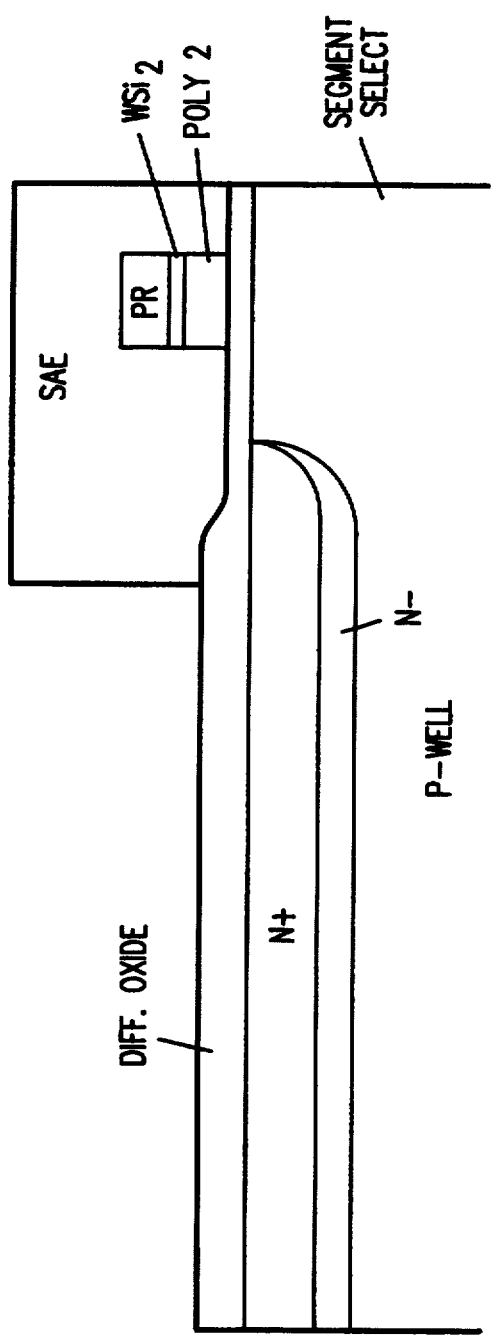
FIG. 5 is a cross-sectional drawing illustrating an intermediate structure formed by a process in accordance with the present invention after formation of the protect array mask.

A process methodology will now be described for fabrication of an alternate metal/source virtual ground (AMSG) flash EPROM cell array in accordance with the concepts of the present invention. The array utilizes cross-point cells with internal access transistors. The EPROM array described below is essentially the Bergemont array described above, but with the addition of segment select lines for isolating segments of the array during read and erase operations. That is, in accordance with the present invention, segment select lines in each segment of the array provide controlled access to the source bit lines in that segment.

FIGS. 1A–1C, 2A–2D, 3A–3D, 4A–4D, 5 and 6 illustrate the sequential steps in a process flow for fabricating a segment accessible flash EPROM array in accordance with the present invention. Each of FIGS. 1C, 2D, 3D and 4D provides a plan view of a portion of the array structure at that stage of the process flow and the following three corresponding cross-sectional views in the structure:

(1) in the word line direction in the EPROM cell array (designated "A/A"), (2) in the word line direction in the select transistor area (designated "B/B"), and (3) in the Poly1 direction perpendicular to the word line in the select transistor area (designated "C/C"). In addition, FIGS. 1A–1B, 2A–2C, 3A–3C and 4A–4D provide cross-sectional views of the structure in the buried N+ graded source direction to show the segment select transistor area (designated "D/D"). The FIG. 5–6 cross-sections show details of the segment select transistor area.

Referring to FIGS. 1A–1C, the process flow begins with conventional steps common to this type of process and, then, with the formation of a 100 Å gate oxide 100 on a P-type silicon substrate 102. A layer of polysilicon (Poly1) 104 is then deposited to a thickness of about 1500 Å and doped with phosphorus at a dose of $2–5\times10^{15}$ at low implant energy.

Next, as further shown in FIGS. 1A–1C, a composite dielectric layer of oxide/nitride/oxide (ONO) 106 is formed on the Poly1. After growing the ONO layer, a photoresist mask 108 is used to define vertical strips on the ONO. The ONO 106 and underlying Poly1 104 are then plasma etched to form parallel strips 110 of ONO/Poly1.

Referring to FIGS. 2A–2D, after stripping the Poly1 photoresist mask 108, a thin edge oxide is grown between the Poly1 strips 110 and a bit line mask is defined to protect the segment select region of the substrate from bit line implant. The Poly1 lines in the array are then used in a self-aligned arsenic implant to define N+ bit lines in the array. Next, alternate N+ bit lines are masked and phosphorus is implanted into the exposed bit lines to provide alternate graded N+/N− source bit lines for the cells of the EPROM array. Optionally, this graded source implant can be followed by a mask step for implanting boron into the drain bit lines, as shown in FIG. 2. These masks protect the segment select transistor region of the device. Ultimately, the N+/N− graded source bit lines are contacted by metal in segmented fashion, i.e. one contact for every 32 or 64 cells, for example, in a given column of the array. The intermediate drain bit lines are uncontacted.

Next, a "differential" oxide is grown over the N+ bit line areas to provide substantial latitude in subsequent ONO and/or poly plasma etch steps. If, for example, a poly plasma etch is performed without formation of the differential oxide, then the poly plasma etch step could lead to the "trenching" of silicon in the exposed N+ bit line areas. For this reason, this step contributes to the equivalent oxide loss during ONO etch and is, hence, called differential oxidation.

Next, as shown in FIGS. 3A–3D, a mask step called "protect array" is performed to etch away, out of the array, residual floating gate oxide (the Poly1 mask is a clear field mask) and differential oxide in the segment select transistor regions of the device. The residual floating gate oxide in the periphery and differential oxide in the segment select line regions is etched off in wet chemistry utilizing diluted HF. Then, the photoresist is stripped.

Referring now to FIGS. 4A–4D, the next step in the process involves the growth of 200 Å gate oxide everywhere in the gate channel regions in the periphery and in the segment select transistor areas. A threshold voltage mask ($V_{tp}$ mask) is then defined and P-channel regions are boron implanted to provide the desired threshold voltage.

After $V_{tp}$ mask photoresist strip, a second layer of 2000 Å polysilicon (Poly2) is deposited and doped with phosphorous. Then, a 2500 Å tungsten silicide layer is deposited and a Poly2 mask is defined. The Poly2 mask has multiple functions: defining the gates of the transistors in the periphery, defining the word lines of the EPROM cells, defining first and second access select lines for each segment of the array, and, in accordance with the present invention, defining segment select lines for each segment of the array.

Next, the tungsten silicide layer and the Poly2 layer are plasma etched. It is noted that the access transistors are flash EPROM cells with larger width than the array flash EPROM cells to drive larger current than the array cells.

Referring to FIG. 5, after this plasma etch, the photoresist is not stripped. A second photoresist is spun on and a self-aligned etch (SAE) masking step is performed. The SAE mask maintains the integrity of the photoresist of the preceding Poly2 mask in order to allow self-aligned etch to Poly2 of the residual ONO/Poly1 layer between the word lines in the flash EPROM cell array. The SAE mask is formed to also protect the segment select lines during the ONO/Poly1 etch.

Figure 6:
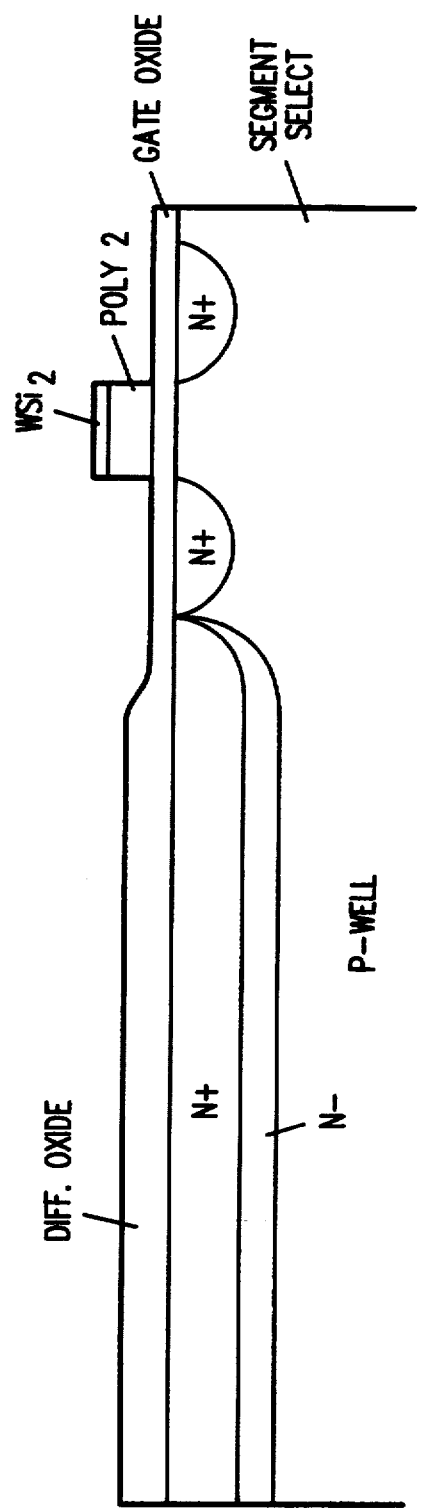
FIG. 6 is a cross-sectional drawing illustrating an intermediate structure formed by a process in accordance with the present invention after definition of N+ source and drain regions in the select transistor area.

After the ONO/Poly1 etch, the SAE mask is removed and a new mask is defined to enable definition of the N+ source and drain regions of the segment select transistors associated with each of the graded source lines in the array, as shown in FIG. 6.

Figure 7:
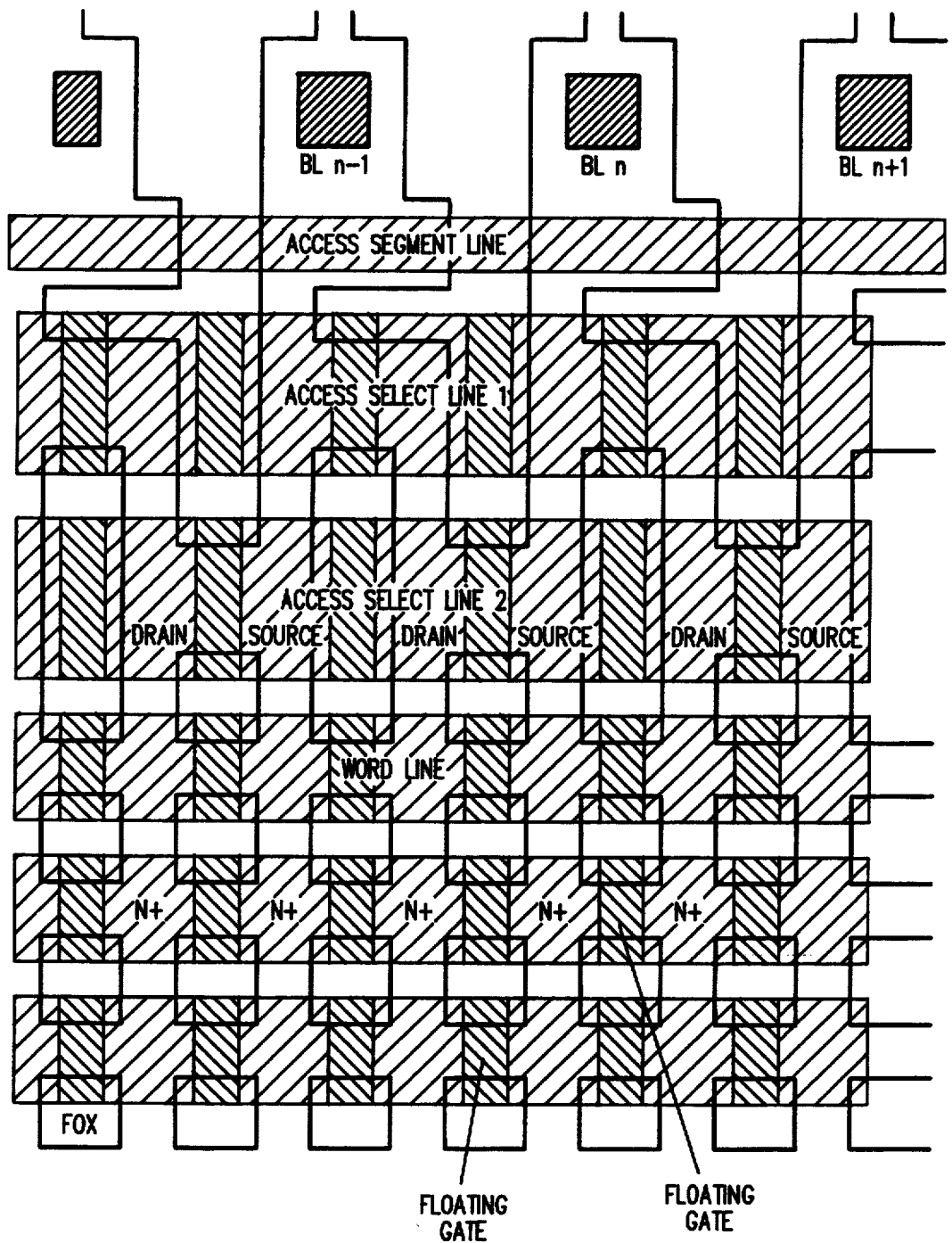
FIG. 7 is a layout illustrating a portion of a segment-erasable flash EPROM array in accordance with the present invention.
Figure 8:
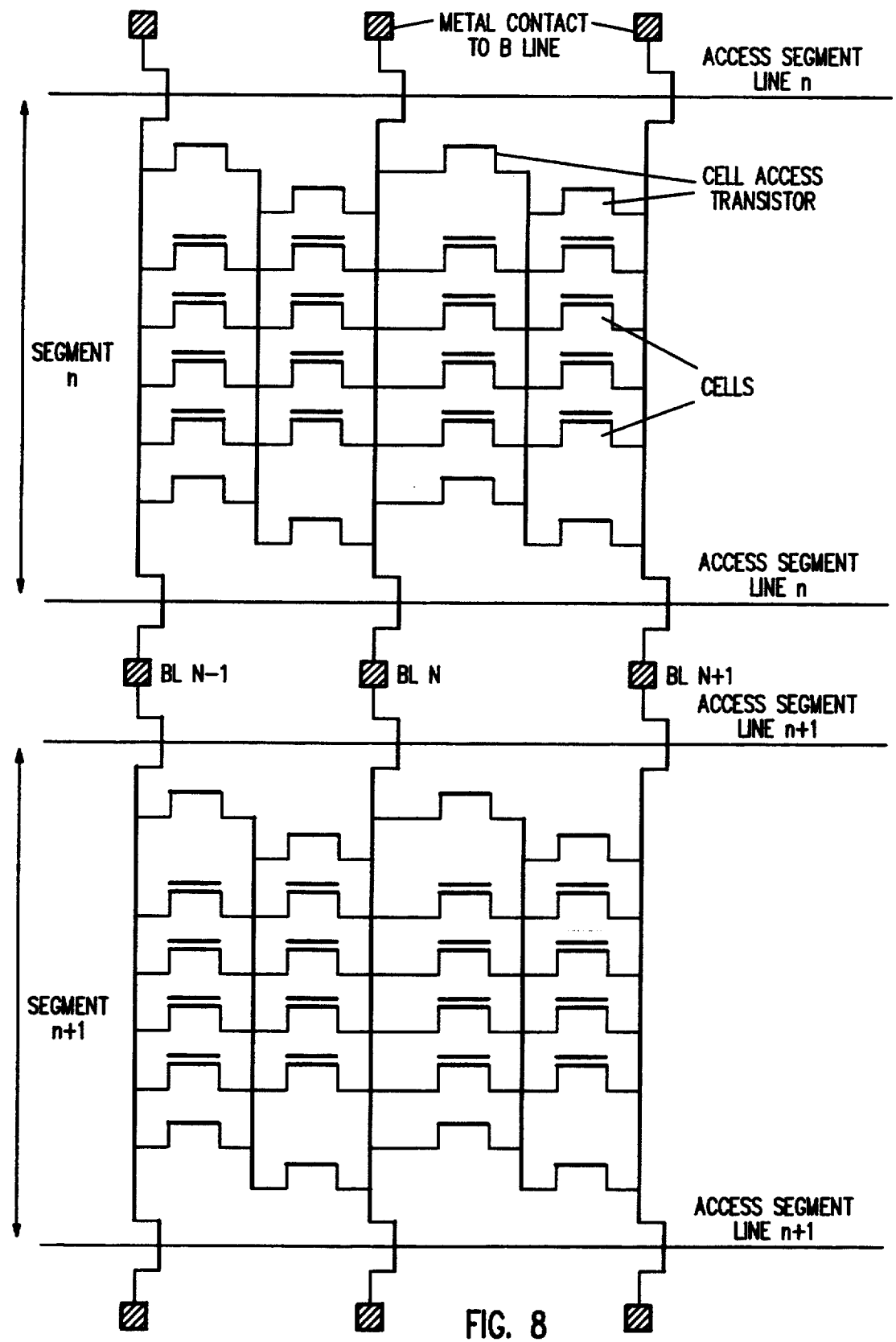
FIG. 8 is a schematic diagram illustrating two segments of a segment-erasable flash EPROM array in accordance with the present invention.

FIG. 7 shows a layout of the resulting structure, with FIG. 8 providing an equivalent schematic diagram for two segments in the array.

Figure 9:
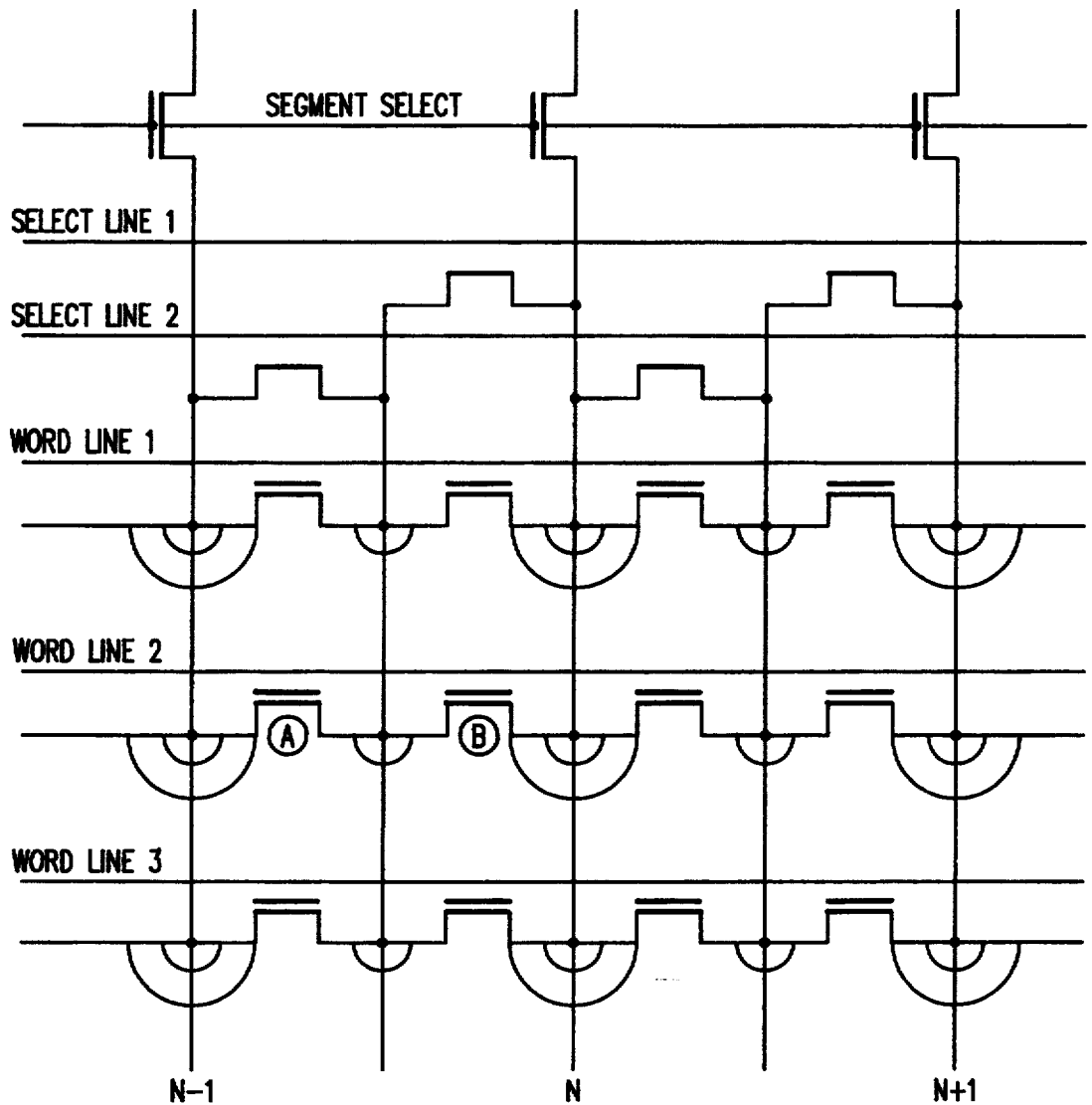
FIG. 9 is a schematic diagram illustrating an equivalence circuit for the FIG. 7 layout.

Referring to FIG. 9, which shows a portion of one segment of a flash EPROM array in accordance with the present invention, to program cell A, with word line 2 at Vpp and the segment select lines for that segment at the programming voltage Vpp, bit line N-1 is held at Vss, bit line N is taken to the supply voltage Vcc (5–7 V), and bit line N+1 is allowed to float; the programming voltage Vpp is applied to select line 1, while select line 2 is held at Vss. This drives the supply voltage Vcc on the intermediate drain bit line, which, as stated above, is non-contacted. This regime causes hot electron injection from the drain side to the floating gate of cell A.

Similarly, to program cell B, with word line 2 and the segment select lines at Vpp, bit line N-1 is taken to Vcc, bit line N is held at Vss, and bit line N+1 is allowed to float; the programming voltage Vpp is applied to select line 2, while select line 1 is held at Vss.

In the "flash" erase mode, the segment select lines in the selected segment are held at the programming voltage Vpp, thereby turning on the segment select transistors in that segment; all other segment select lines in the array are held at Vss. Erase voltage Ver is applied to each of the bit lines (N-1, N, and N+1) in the selected segment, while select line 1 and select line 2 are held at Vss. This cause Fowler-Nordheim tunneling of electrons from the floating gate to the source side of each cell in the segment. The graded N+/N− source junction prevents junction breakdown.

Thus, during the erase operation, only one (or X) segment(s) is addressed through the segment select lines, allowing true segment erase. True segment erase enhances reliability and minimizes source erase disturb on other non-selected segments during the erase operation.

To read cell A, the segment select lines of the selected segment are held at Vcc, and all bit lines of the selected segment are precharged to a read voltage Vrd (1.5–2 V). Select line 1 is held at Vcc and select line 2 is held at Vss. Then, bit line N is pulled down to Vss, bringing the intermediate drain to Vss. All other segment select lines are held at Vss.

Similarly, to read cell B, the segment select lines are held at Vcc, and all bit lines in the segment are precharged to the read voltage Vrd. Select line 2 is held at Vss and select line 2 is held at Vcc. Then, bit line $BL_{n-1}$ is pulled down to Vss, bringing the intermediate drain to Vss.

Performing the read operation with the read voltage Vrd on the source enhances soft write immunity because the source is graded. This allows reading with a high read voltage. This leads to higher read current and speed which, in turn, leads to faster read access. Furthermore, as stated above during reading, only one segment of the array is precharged. This lowers the bit line capacitance to the capacitance of only one segment plus an aluminum bit line, further increasing read access speed. For example, if a bit line has a total of 1024 cells and each segment has 64 cells, then read isolation of a segment using the segment select lines reduces bit line capacitance by a factor of 16.

It should be understood that various alternatives to the embodiments of the invention described herein may be employed in practicing the invention. It is intended that the following claims define the scope of the invention and that methods and structures within the scope of these claims and their equivalents be covered thereby.

What is claimed:

1. A method of fabricating a segment-erasable flash EPROM array in a silicon substrate of P-type conductivity, the method comprising:
   (a) forming a layer of first insulating material on the silicon substrate;
   (b) forming a layer of first conductive material on the first insulating material;
   (c) forming a layer of second insulating material on the layer of first conductive material;
   (d) etching selected portions of the layer of second insulating material and underlying first conductive material to form a plurality of spaced-apart parallel strips of second insulating material and underlying first conductive material;
   (e) introducing N-type dopant into the silicon substrate regions between the parallel strips of second insulating material and underlying first conductive material to formed space-apart buried N+ bit lines;

(f) introducing additional N-type dopant into alternate buried N+ bit lines to form graded source lines that alternate with buried N+ drain lines, each of the graded source lines having only one electrical contact for a plurality of EPROM cells sharing said graded source line such that the flash EPROM array is subdivided into a plurality of segments, the alternate drain lines being uncontacted;

(g) forming a plurality of spaced-apart parallel word lines of second conductive material, said word lines formed perpendicular to the strips of second insulating material and underlying first conductive material and such that the second conductive material is separated from the first conductive material by the second insulating material whereby the intersection of the first and second conductive material defines the location of a cross-point EPROM cell of the array;

(h) forming first and second spaced-apart parallel select lines of second conductive material in each segment of the array said select lines formed perpendicular to the strips of second insulating material and underlying first conductive material and such that the second conductive material is separated from the first conductive material by the second insulating material whereby the intersection of the first and second select lines with the first conductive material defines the location of first and second select transistors such that each buried N+ drain line is electrically connectable to one of its adjacent graded source lines via the first select transistor having its gate provided by the first select line and to the other adjacent graded source line via a second select transistor having its gate provided by the second select line;

(i) forming first and second segment select lines in each segment of the array, said segment select lines defining the gate of a segment select transistor associated with each graded source line.

2. A method of programming a selected EPROM cell in a segment-erasable flash EPROM array fabricated in accordance with the claim 1 method, the programming method comprising the steps of:
(a) maintaining the word line associated with the selected cell at a preselected programming voltage;
(b) maintaining the segment select lines at the preselected programming voltage;
(c) maintaining the graded source bit line associated with the selected cell at ground while maintaining the uncontacted drain bit line associated with the selected cell at a positive supply voltage;
(d) applying the programming voltage to the first select line while maintaining the second select line at ground
whereby the supply voltage is driven on the drain bit line thereby causing hot electron ejection from the drain bit line to the floating gate of the selected EPROM cell.

3. A method of flash erasing a selected segment of EPROM cells in a segment-erasable flash EPROM array fabricated in accordance with the claim 1 method, the flash erase method comprising the steps of:
(a) maintaining the first and second segment select lines of the selected segment at a preselected programming voltage thereby turning on the segment select transistors in the selected segment;
(b) maintaining all segment lines in the array other than the first and second segment select lines of the selected segment at ground;
(c) applying an erase voltage to each of the bit lines in the selected segment while maintaining the first and second select lines at ground
thereby causing Fowler-Nordheim tunneling of electrons from the floating gate of programmed EPROM cells in the selected segment to the source side of each such programmed EPROM cell.

4. A method of reading a selected EPROM cell in a segment-erasable flash EPROM array fabricated in accordance with the claim 1 method, the read method comprising the steps of:
(a) maintaining the first and second segment select lines of the segment of the flash EPROM array that includes the selected EPROM cell at a positive supply voltage;
(b) precharging all bit lines of said segment to a preselected read voltage;
(c) maintaining the first select line at the positive supply voltage and the second select line at ground;
(d) pulling the source bit line of an EPROM cell adjacent to the selected EPROM cell to ground while and also pulling the drain bit line intermediate the adjacent EPROM cell and the selected EPROM cell to ground; and
(e) maintaining all segment select lines other than the first and second segment lines at ground.

5. A method as in claim 1 wherein the first insulating material comprises silicon dioxide.

6. A method as in claim 5 wherein the first conductive material comprises polysilicon.

7. A method as in claim 6 wherein the second insulating material comprises oxide/nitride/oxide (ONO).

8. A method as in claim 7 wherein the second conductive material comprises polysilicon.

* * * * *